(12) United States Patent
Gilliland

(10) Patent No.: US 7,521,637 B2
(45) Date of Patent: Apr. 21, 2009

(54) MULTILAYER PRINTED CIRCUIT BOARD HAVING VIA ARRANGEMENTS FOR REDUCING CROSSTALK AMONG VIAS

(75) Inventor: Don A. Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 529 days.

(21) Appl. No.: 11/297,303

(22) Filed: Dec. 8, 2005

(65) Prior Publication Data

US 2007/0131452 A1    Jun. 14, 2007

(51) Int. Cl.
*H01R 12/04* (2006.01)
*H05K 1/11* (2006.01)
*H01K 3/10* (2006.01)

(52) U.S. Cl. .................................. 174/262; 29/853

(58) Field of Classification Search ......... 174/262–266; 361/792–795; 29/852–853
See application file for complete search history.

(56) References Cited

U.S. PATENT DOCUMENTS 5,328,752 A * 7/1994 Miyazato .................... 428/209
5,695,847 A * 12/1997 Browne ...................... 428/112

\* cited by examiner

*Primary Examiner*—Jeremy C Norris
(74) *Attorney, Agent, or Firm*—Dillon & Yudell LLP

(57) ABSTRACT

A printed circuit board having via arrangements for reducing crosstalk is disclosed. The printed circuit board includes a first layer and a second layer. The printed circuit board also includes a first via and a second via, both traveling from the first layer to the second layer. The first via is orthogonal to the second via in a three dimensional space. In addition, the printed circuit board may include a third via traveling from the first layer to the second layer, and the third via is orthogonal to the first and second vias in the three dimensional space.

16 Claims, 4 Drawing Sheets

MULTILAYER PRINTED CIRCUIT BOARD HAVING VIA ARRANGEMENTS FOR REDUCING CROSSTALK AMONG VIAS

BACKGROUND OF THE INVENTION

1. Technical Field

The present invention relates to printed circuit boards in general, and, in particular, to multilayer printed circuit boards. Still more particularly, the present invention relates to a multilayer printed circuit board having via arrangements for reducing crosstalk among vias.

2. Description of Related Art

A printed circuit board (PCB) typically includes a number of conductive layers (hereinafter referred to as "layers") separated by insulation such as FR4. Electronic components mounted on one or more surfaces of the PCB can be functionally interconnected through the conductive layers. Routing traces are commonly used to carry signals transmitted among the electronic components mounted on the PCB. Some PCBs have multiple layers of routing traces to accommodate all of the interconnections.

Traces located within different layers of a multilayer PCB are typically connected electrically by vias formed within the PCB. A via can be made by making a hole through some or all the layers within a PCB and the interior hole surface is then coated or plated with an electrically conductive material. A via that connects all layers of a PCB, including the outer layers, is called a through via.

Due to the proximity of vias within a PCB, objectionable crosstalk may occur between one set of vias that are capable of providing the source for coupled energy to another set of vias. Consequently, it would be desirable to provide an improved multilayer printed circuit board with reduced crosstalk among vias.

SUMMARY OF THE INVENTION

In accordance with a preferred embodiment of the present invention, a printed circuit board includes a first layer and a second layer. The printed circuit board also includes a first via and a second via, both traveling from the first layer to the second layer. The first via is orthogonal to the second via in a three dimensional space. In addition, the printed circuit board may include a third via traveling from the first layer to the second layer, and the third via is orthogonal to the first and second vias in the three dimensional space.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Within a multilayer printed circuit board (PCB), crosstalk may occur between two vias when the signals in one via (i.e., a culprit via) adversely affects the signals in an another via (i.e., a victim via) because of their proximity to each other. The crosstalk between the culprit via and the victim via has an inductive component and a capacitive component. The inductive component is zero when the culprit via and the victim via are orthogonal to each other. Conversely, the inductive component is not zero when the culprit via and the victim via are not orthogonal to each other.

In accordance with a preferred embodiment of the present invention, specific angles are assigned to a culprit via and a victim via such that the culprit via and the victim via become orthogonal from each other. The definition of orthogonality is that the dot product $$A \cdot B = 0$$

where A is a vector representing the culprit via, and B is a vector representing the victim via. Similarly, when there are three vias in a PCB, then crosstalk among the three vias can be reduced by placing the three vias orthogonal from each other. In other words, $$A \cdot B = 0$$
$$B \cdot C = 0$$
$$C \cdot A = 0$$

where A is a vector representing a first via, B is a vector representing a second via, and C is a vector representing a third via.

Figure 1:
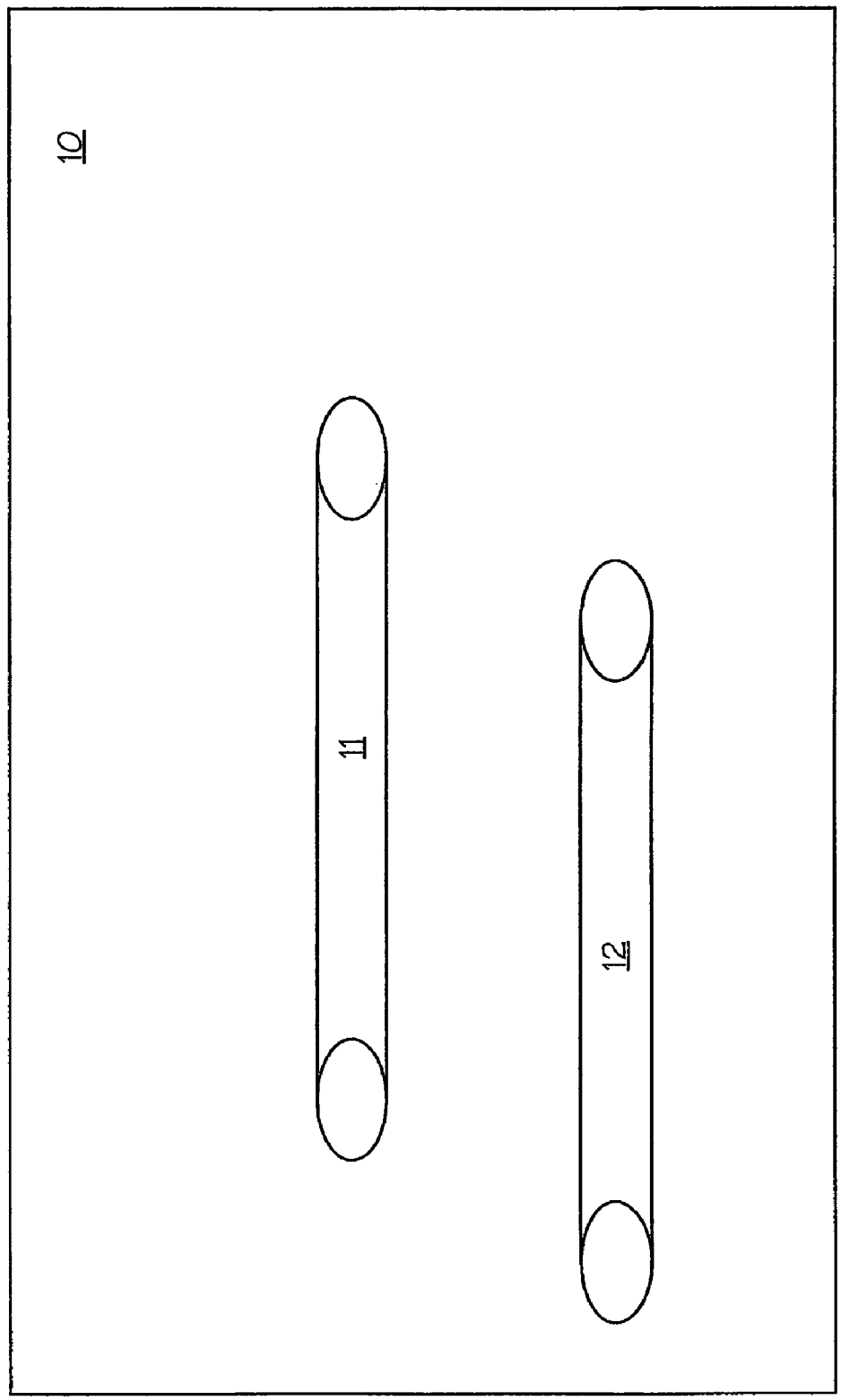
FIG. 1 is a top view of a multilayer printed circuit board having two vias arranged in accordance with a preferred embodiment of the present invention.
Figure 2:
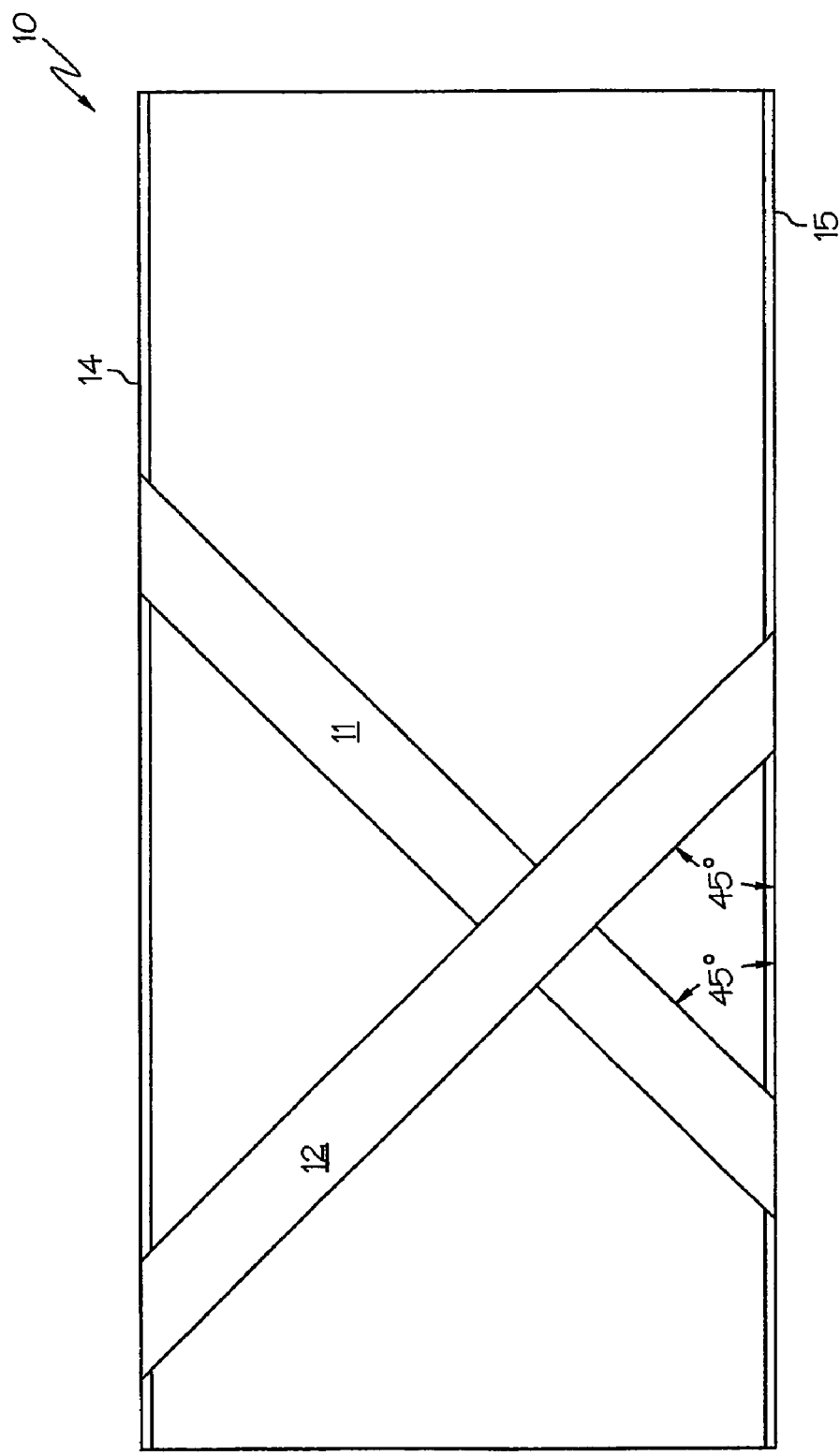
FIG. 2 is a side view of the two vias from FIG. 1, in accordance with a preferred embodiment of the present invention.

Referring now to the drawings and in particular to FIGS. 1 and 2, there are depicted a top view and a side view, respectively, of a multilayer PCB having two vias arranged in accordance with a preferred embodiment of the present invention. As shown in FIGS. 1 and 2, a PCB 10 includes a first layer 14 and a second layer 15. PCB 10 also includes a first via 11 and a second via 12. First via 11 and second via 12 are shown without any lead-in traces connecting them to their respective circuitry. First via 11 travels from first layer 14 to second layer 15. Second via 12 also travels from first layer 14 to second layer 15.

In FIG. 1, which is the top view of PCB 10, first via 11 and second via 12 are shown to be parallel to each other. In FIG. 2, which is the side view of PCB 10, first via 11 is shown to have an elevation of 45 degrees with respect to second layer 15 of PCB 10, and second via 12 is shown to also have an elevation of 45 degrees with respect to second layer 15 of PCB 10. In a three dimensional space, first via 11 and second via 12 are orthogonal to each other. In other words, the dot product of a vector representing first via 11 and a vector representing second via 12 is zero.

Figure 3:
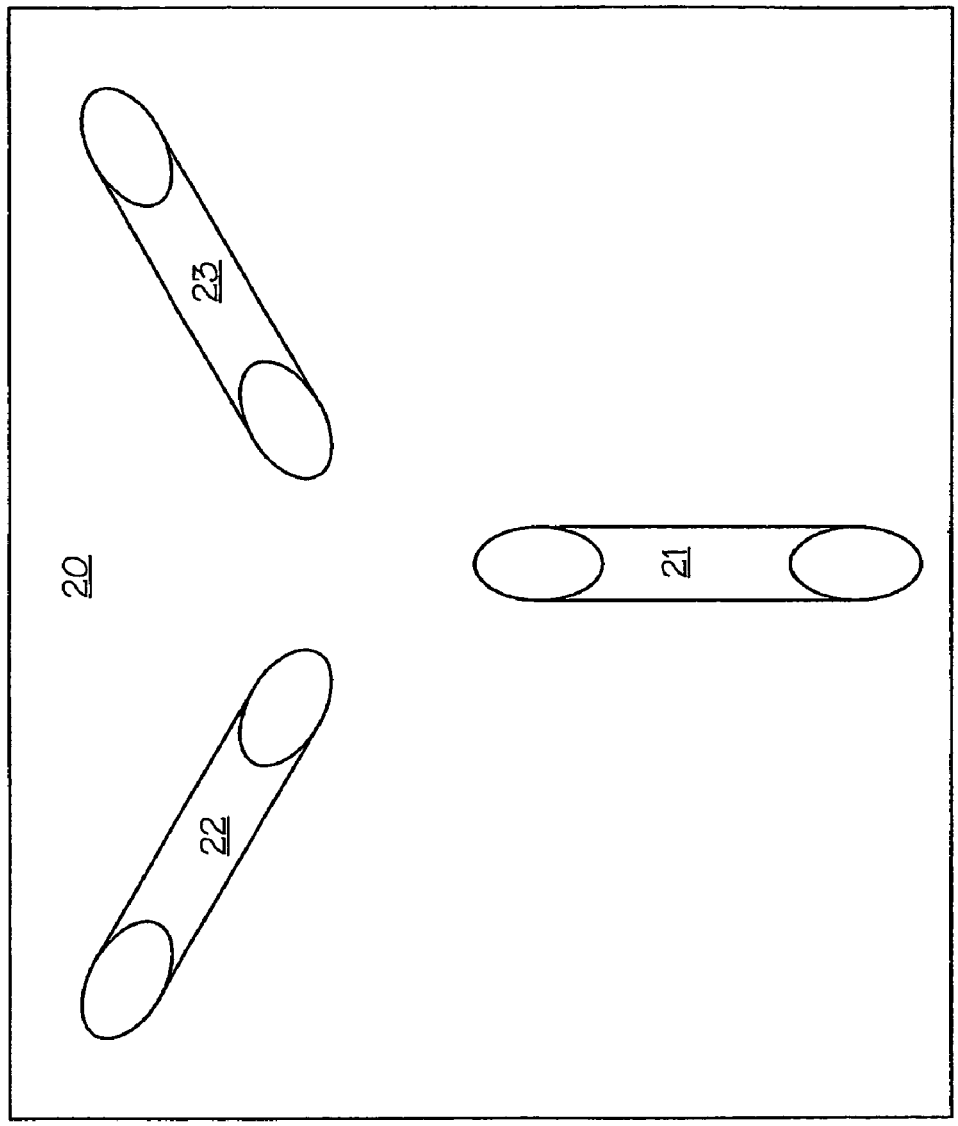
FIG. 3 is a top view of a multilayer printed circuit board having three vias arranged in accordance with a preferred embodiment of the present invention.
Figure 4:
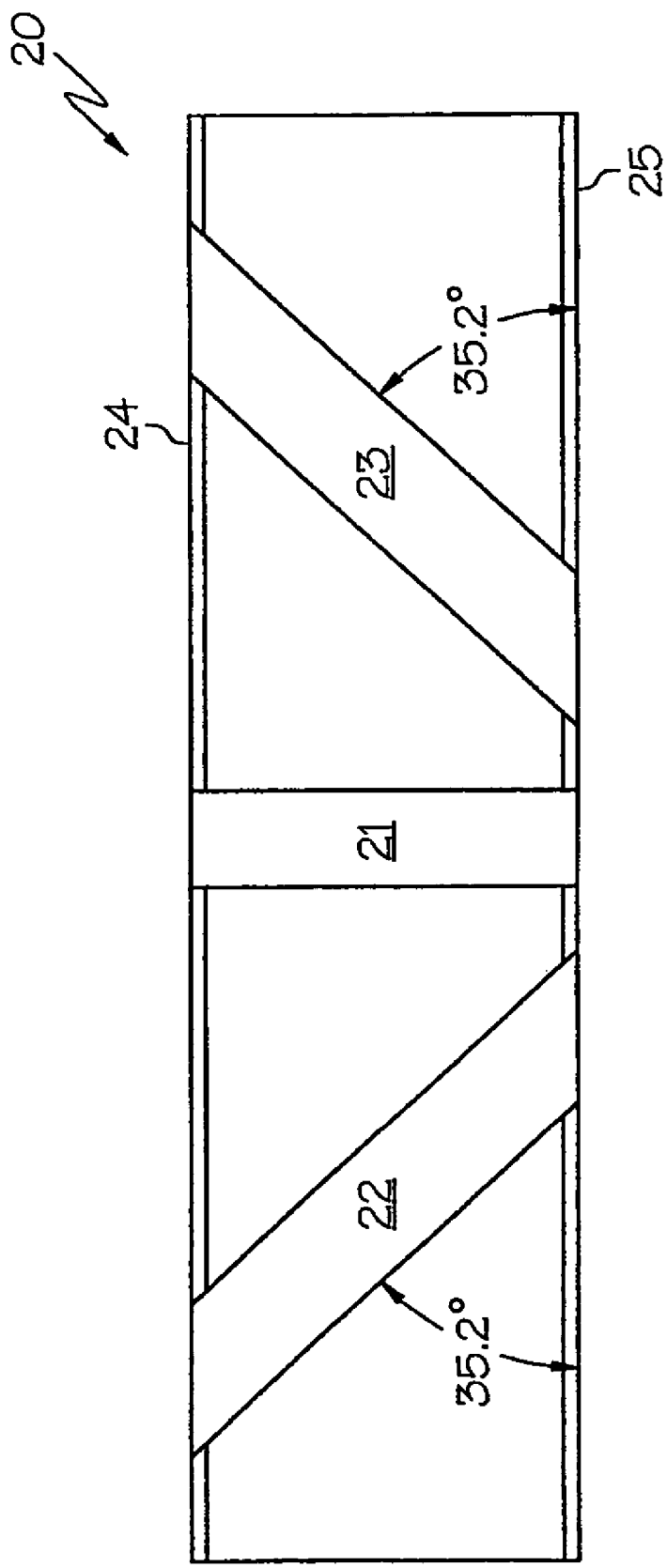
FIG. 4 is a side view of the three vias from FIG. 3, in accordance with a preferred embodiment of the present invention.

Referring now to FIGS. 3 and 4, there are depicted a top view and a side view, respectively, of a multilayer PCB having three vias arranged in accordance with a preferred embodiment of the present invention. As shown in FIGS. 3 and 4, a PCB 20 includes a first layer 24 and a second layer 25. PCB 20 also includes a first via 21, a second via 22, and a third via 23. First via 21, second via 22, and third via 23 are shown without any lead-in traces connecting them to their respective circuitry. First via 21 travels from first layer 24 to second layer 25. Similarly, second via 22 and third via 23 also travel from first layer 24 to second layer 25.

In FIG. 3, which is the top view of PCB 20, first via 21, second via 22, and third via 23 are shown to be 120 degrees from each other. In FIG. 4, which is the side view of PCB 20, second via 22 is shown to have an elevation of 35.2 degrees with respect to second layer 25 of PCB 20, and third via 23 is shown to also have an elevation of 35.2 degrees with respect to second layer 25 of PCB 20. However, the showing is of a three-dimensional embodiment onto a two-dimensional side view involves projection; thus, vias 21-23 may not visually appear to be 35.2 degrees with respect to second layer 25 of PCB 20 in FIG. 4, and first via 21 only appears to be 90 degrees with respect to second layer 25 of PCB 20 in FIG. 4.

In the actual three dimensional space, first via 21, second via 22, and third via 23 are orthogonal to each other. In other words, the dot product of the vectors representing first via 21 and second via 22 is zero, the dot product of the vectors representing second via 22 and third via 23 is zero, and the dot product of the vectors representing third via 23 and first via 21 is zero.

Once orthogonalities among vias have been established, the orthogonalities among vias will be maintained regardless of translation. For example, once the orthogonalities among vias 21-23 have been established, vias 21-23 may be placed anywhere within PCB 20 without losing their orthogonalities to each other as long as vias 21-23 maintain their orientation (i.e., without being rotated).

Even if true orthogonality cannot be obtained or the preferred elevations (such as the 45 degree elevations in the two-via arrangement in FIGS. 1-2 or the 35.2 degree elevations in the three-via arrangement in FIGS. 3-4) cannot be achieved for whatever reason, improvements can be made at other elevations to allow the dot product of the vectors representing the two vias (such as the dot product of the vectors representing vias 11 and 12 in FIGS. 1-2) to be as close to zero as possible, and/or the dot products of the vectors representing the three vias (such as the dot product of the vectors representing vias 21 and 22, the dot product of the vectors representing vias 22 and 23, and the dot product of the vectors representing vias 23 and 21 in FIGS. 3-4) to be as close to zero as possible.

As has been described, the present invention provides a multilayer PCB having via arrangements for reducing crosstalk among vias.

While the invention has been particularly shown and described with reference to a preferred embodiment, it will be understood by those skilled in the art that various changes in form and detail may be made therein without departing from the spirit and scope of the invention.

What is claimed is:

1. A multi-layer printed circuit board comprising:
   a first layer and a second layer within said multi-layer printed circuit board;
   a first via travels from said first layer to said second layer; and
   a second via travels from said first layer to said second layer, wherein said second via is orthogonal to said first via in a three dimensional space.

2. The printed circuit board of claim 1, wherein a dot product between a vector representing said first via and a vector representing said second via is zero.

3. The printed circuit board of claim 1, wherein said first via is at a 45 degree elevation from said second layer.

4. The printed circuit board of claim 1, wherein said second via is at a 45 degree elevation from said second layer.

5. The printed circuit board of claim 1, wherein said printed circuit board further includes a third via travels from said first layer to said second layer, wherein said third via is orthogonal to said first via and said second via in a three dimensional space.

6. The printed circuit board of claim 5, wherein a dot product between a vector representing said third via and a vector representing said first via is zero.

7. The printed circuit board of claim 5, wherein a dot product between a vector representing said third via and a vector representing said second via is zero.

8. The printed circuit board of claim 1, wherein said first layer and said second layer are substantially identical to each other.

9. A method for reducing crosstalk among vias within a multi-layer printed circuit board having a first layer and a second layer, said method comprising:
   furnishing a first via that travels from said first layer to said second layer of said multi-layer printed circuit board; and
   furnishing a second via that travels from said first layer to said second layer of said multi-layer printed circuit board, wherein said second via is orthogonal to said first via in a three dimensional space.

10. The method of claim 9, wherein a dot product between a vector representing said first via and a vector representing said second via is zero.

11. The method of claim 9, wherein said first via is at a 45 degree elevation from said second layer.

12. The method of claim 9, wherein said second via is at a 45 degree elevation from said second layer.

13. The method of claim 9, wherein said method further includes furnishing a third via that travels from said first layer to said second layer, wherein said third via is orthogonal to said first via and said second via in a three dimensional space.

14. The method of claim 13, wherein a dot product between a vector representing said third via and a vector representing said first via is zero.

15. The method of claim 13, wherein a dot product between a vector representing said third via and a vector representing said second via is zero.

16. The method of claim 9, wherein said first layer and said second layer are substantially identical to each other.

* * * * *